United States Patent
Mizuno

(10) Patent No.: US 7,397,053 B2
(45) Date of Patent: Jul. 8, 2008

(54) ELECTRON BEAM CONTROL METHOD, ELECTRON BEAM DRAWING APPARATUS AND METHOD OF FABRICATING A SEMICONDUCTOR DEVICE

(75) Inventor: Hiroyuki Mizuno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 448 days.

(21) Appl. No.: 11/260,254

(22) Filed: Oct. 28, 2005

(65) Prior Publication Data
US 2006/0097191 A1    May 11, 2006

(30) Foreign Application Priority Data
Oct. 28, 2004    (JP) .............. 2004-314076

(51) Int. Cl.
*H01J 49/00* (2006.01)
(52) U.S. Cl. .................. 250/492.22; 250/492.3
(58) Field of Classification Search .......... 250/492.22, 250/492.23
See application file for complete search history.

(56) References Cited

U.S. PATENT DOCUMENTS

| | | | | |
|---|---|---|---|---|
| 5,614,725 A * | 3/1997 | Oae et al. | .............. | 250/492.22 |
| 5,757,019 A * | 5/1998 | Murai et al. | ........... | 250/492.22 |
| 6,486,479 B1 * | 11/2002 | Oae et al. | ................ | 250/492.2 |
| 6,495,841 B1 | 12/2002 | Ando et al. | | |
| 6,507,034 B1 | 1/2003 | Nakasugi | | |
| 6,703,629 B2 * | 3/2004 | Nakasugi | ................ | 250/492.22 |
| 6,914,252 B2 * | 7/2005 | Nakasugi | ................ | 250/492.22 |
| 6,969,862 B2 * | 11/2005 | Muraki et al. | ........... | 250/492.22 |
| 7,045,801 B2 * | 5/2006 | Nakasugi | ................ | 250/492.22 |
| 7,102,147 B2 * | 9/2006 | Inanami et al. | ........ | 250/492.23 |
| 2006/0097191 A1 * | 5/2006 | Mizuno | ................... | 250/492.2 |

FOREIGN PATENT DOCUMENTS

JP    11-54396    2/1999

* cited by examiner

*Primary Examiner*—David A. Vanore
(74) *Attorney, Agent, or Firm*—Finnegan, Henderson, Farabow, Garrett & Dunner, L.L.P.

(57) ABSTRACT

An electron beam control method has the following steps, selecting one of a plurality of pattern openings by a character beam electrode having a plurality of electrode units to allow an electron beam to pass through any pattern opening on an aperture mask on which the plurality of pattern openings are formed, determining whether or not a synchronization error of deflected operation of the electron beam performed by the plurality of electrode units is equal to or less than a tolerance, determining whether or not the electron beam is irradiated with a sample by selecting the pattern openings in sequence by the character beam electrode in a state of controlling a path of the electron beam by a blanking electrode not to irradiate the sample with the electron beam, when determined that the synchronization error is equal to or less than the tolerance, and decreasing the tolerance when determined that the electron beam is irradiated with the sample.

20 Claims, 3 Drawing Sheets

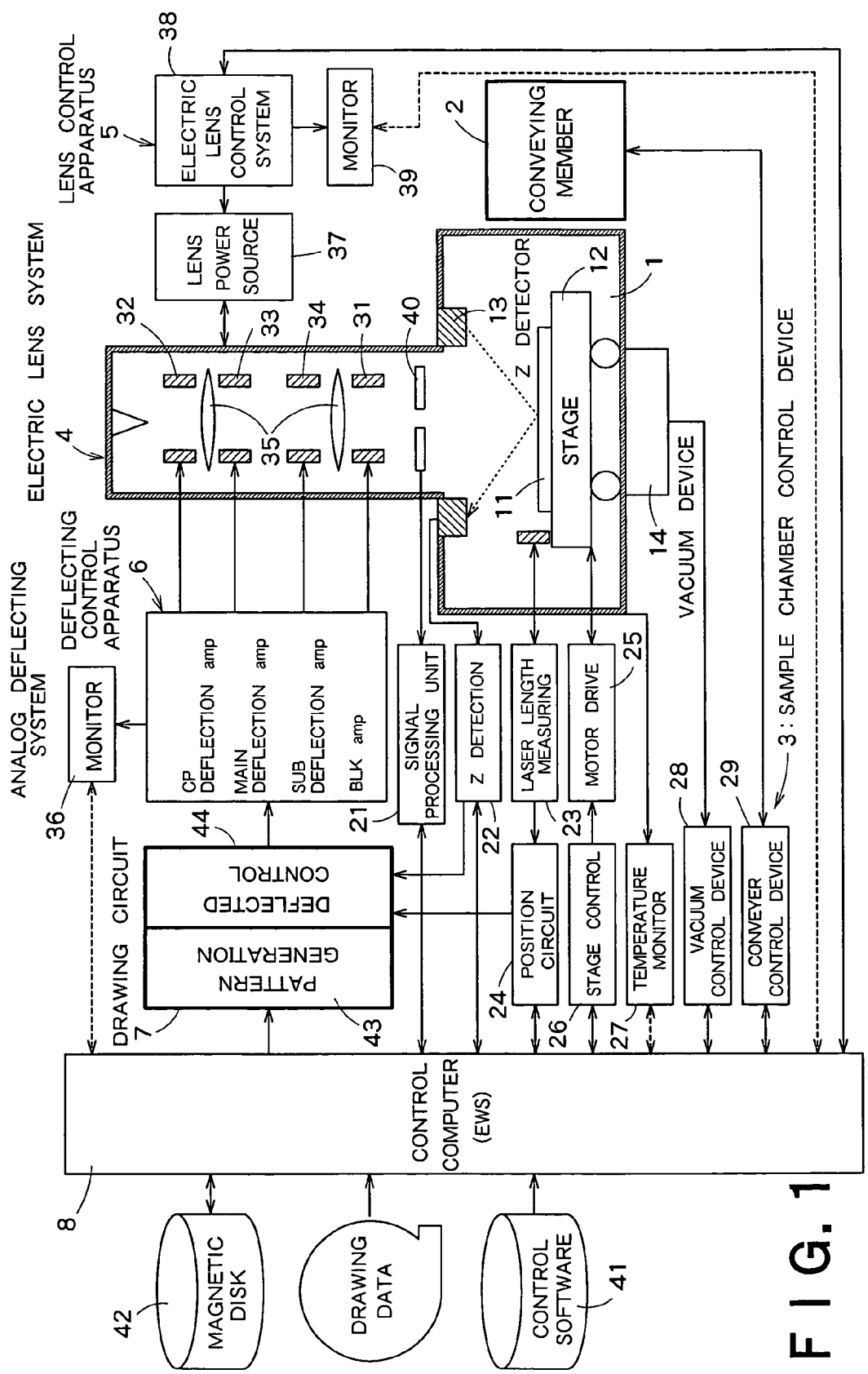
F I G. 1

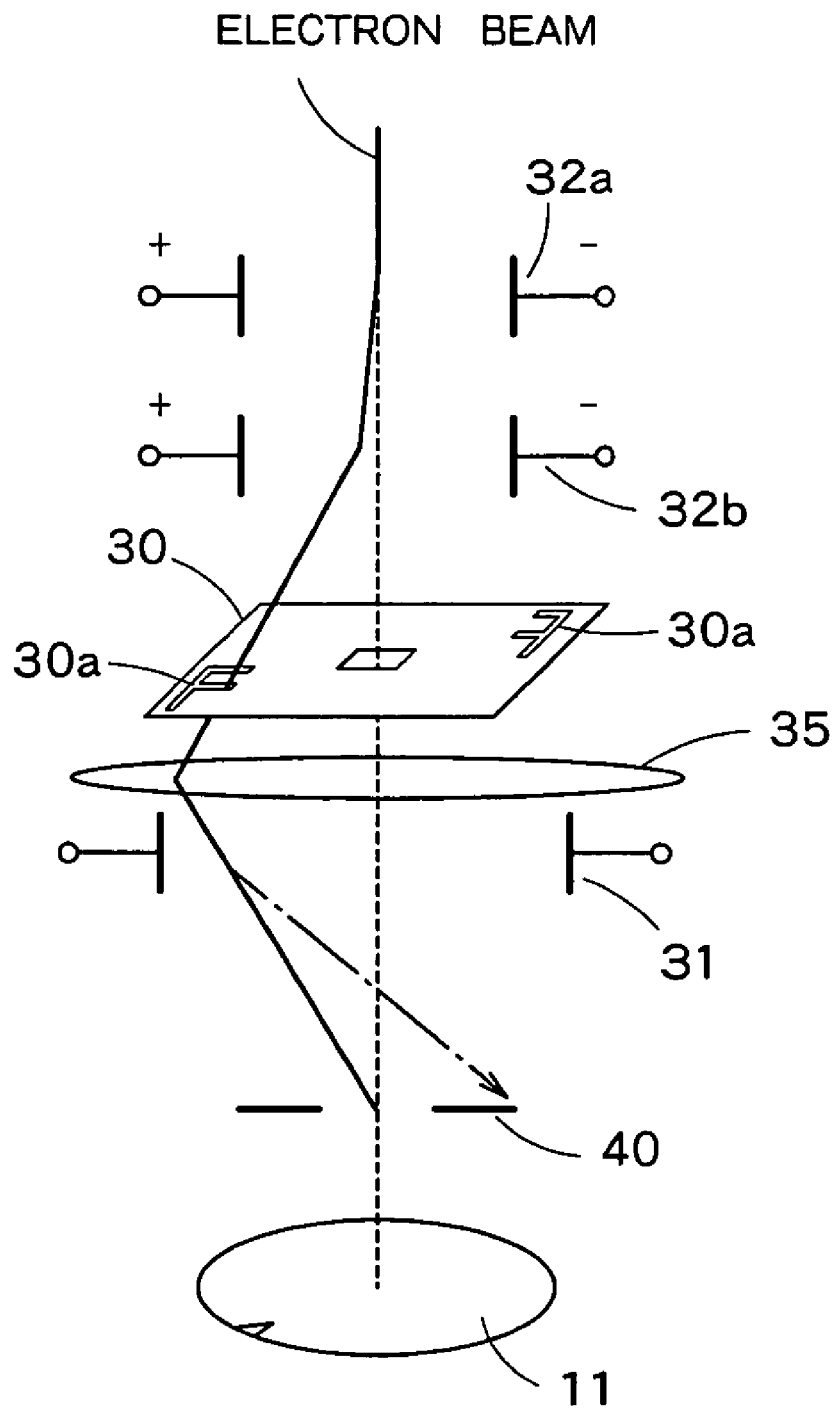
F I G. 2

ELECTRON BEAM CONTROL METHOD, ELECTRON BEAM DRAWING APPARATUS AND METHOD OF FABRICATING A SEMICONDUCTOR DEVICE

CROSS REFERENCE TO RELATED APPLICATIONS

This application claims benefit of priority under 35 USC§119 to Japanese Patent Application No. 2004-314076, filed on Oct. 28, 2004, the entire contents of which are incorporated by reference herein.

BACKGROUND OF THE INVENTION

1. Field of the Invention

The present invention relates to an electron beam control method of controlling a path of an electron beam, an electron beam drawing apparatus and a method of fabricating a semiconductor device.

2. Related Art

To improve a throughput of an electron beam drawing apparatus, an electron beam drawing apparatus of a character projection scheme has been proposed. In this scheme, a plurality of pattern openings having a plurality of shapes are formed in an aperture mask and selectively irradiates the pattern openings with an electron beam. Therefore, a beam pattern generated by the electron beam passing through the pattern openings is projected with a reduced size on a sample such as a semiconductor wafer (see Japanese Patent Laid-Open No. 11-54396).

In the character projection scheme, the pattern openings corresponding to a repeated pattern included in a drawing pattern are formed in advance in the aperture mask. The surface of the sample is scanned while a CP selective deflector deflects the electron beam to pass through an arbitrary pattern opening.

However, the character projection scheme uses the CP selective deflector to deflect the electron beam by a larger amount than conventional variable shaping schemes. Consequently, the electron beam is likely to deviate from an ideal optical axis, and beam leakage may occur.

When such beam leakage occurs, the pattern cannot be accurately drawn on the sample, thereby deteriorating yield.

SUMMARY OF THE INVENTION

An electron beam control method according to one embodiment of the present invention, comprising:

selecting one of a plurality of pattern openings by a character beam electrode having a plurality of electrode units to allow an electron beam to pass through any pattern opening on an aperture mask on which the plurality of pattern openings are formed;

determining whether or not a synchronization error of deflected operation of the electron beam performed by the plurality of electrode units is equal to or less than a tolerance;

determining whether or not the electron beam is irradiated with a sample by selecting the pattern openings in sequence by the character beam electrode in a state of controlling a path of the electron beam by a blanking electrode not to irradiate the sample with the electron beam, when determined that the synchronization error is equal to or less than the tolerance; and decreasing the tolerance when determined that the electron beam is irradiated with the sample.

An electron beam drawing apparatus according to one embodiment of the present invention, comprising:

a blanking electrode which controls a path of an electron beam not to irradiate a sample with the electron beam;

a character beam electrode having a plurality of electrode units, which selects one of a plurality of pattern openings formed on an aperture mask to allow the electron beam to pass through the selected pattern opening; and a deflected control unit which controls voltages or currents applied to the blanking electrode and the character beam electrode, wherein the deflected control unit includes:

a synchronization error determination unit which determines whether or not a synchronization error of the deflected operation of the electron beam performed by the plurality of electrode units is equal to or less than a predetermined tolerance;

a beam irradiation determination unit which selects in sequence the plurality of pattern openings by the character beam electrode in a state of driving the blanking electrode when determined that the synchronization error is equal to or less than the tolerance, to determine whether or not the electron beam is irradiated with the sample; and a tolerance control unit which decreases the tolerance when determined that the electron beam is irradiated with the sample by the beam irradiation determination unit.

A method of fabricating a semiconductor device according to one embodiment of the present invention, comprising:

selecting one of a plurality of pattern openings by a character beam electrode having a plurality of electrode units to allow an electron beam to pass through any pattern opening on an aperture mask on which the plurality of pattern openings are formed;

determining whether or not a synchronization error of deflected operation of the electron beam performed by the plurality of electrode units is equal to or less than a tolerance;

determining whether or not the electron beam is irradiated with a sample by selecting the pattern openings in sequence by the character beam electrode in a state of controlling a path of the electron beam by a blanking electrode not to irradiate the sample with the electron beam, when determined that the synchronization error is equal to or less than the tolerance;

decreasing the tolerance when determined that the electron beam is irradiated with the sample; and performing a fabrication of the semiconductor device after adjusting the synchronization error of the deflected operation of the electron beam to be equal to or less than the tolerance.

BRIEF DESCRIPTION OF THE DRAWINGS

FIG. 1 is a block diagram showing the entire configuration of an electron beam drawing apparatus in accordance with an embodiment of the present invention;

FIG. 2 is a diagram showing an example of locus of an electron beam; and

DETAILED DESCRIPTION OF THE INVENTION

Figure 3:
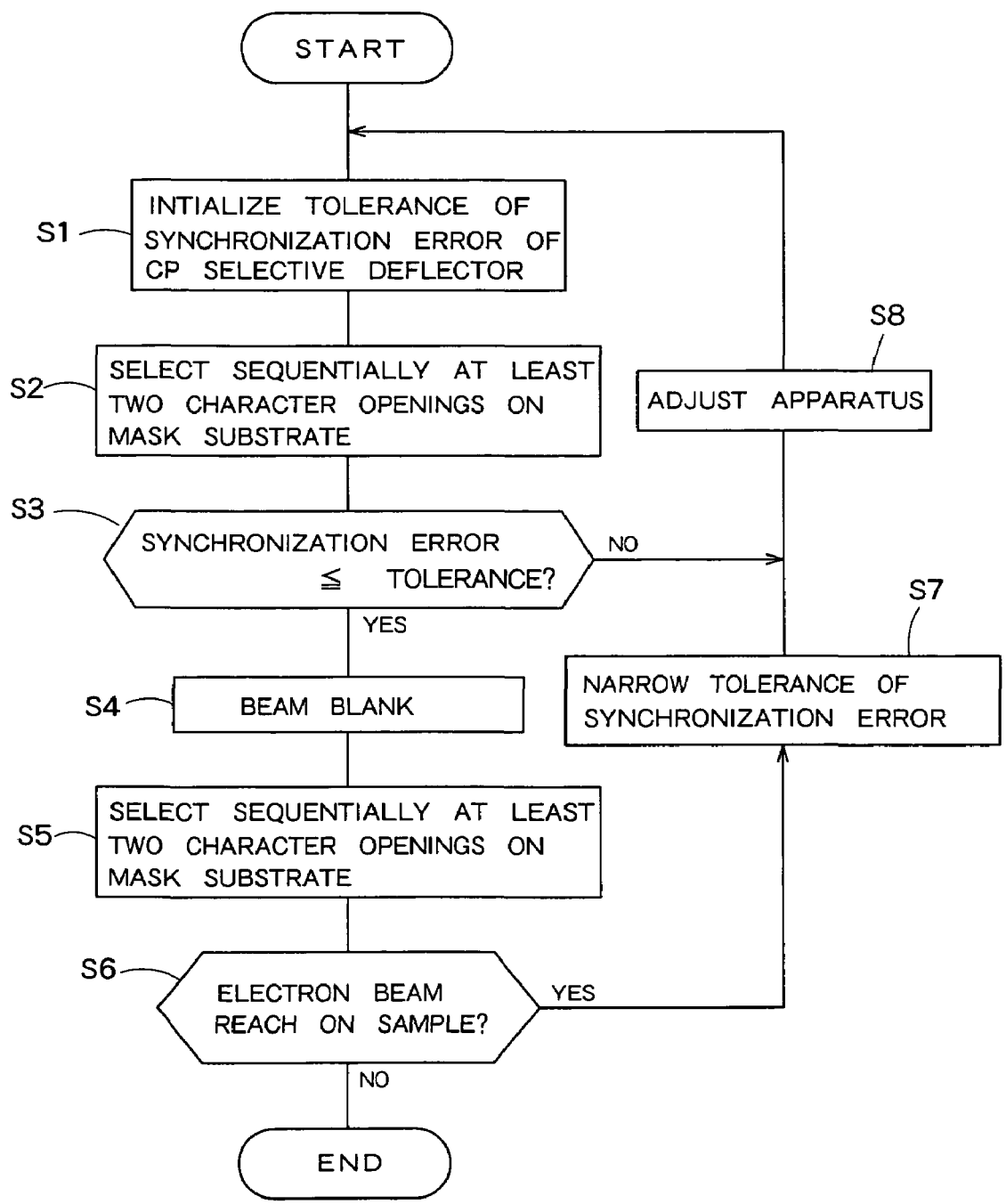
FIG. 3 is a flowchart showing an example of a processing operation of the electron beam drawing apparatus in accordance with the present embodiment.

An embodiment of the present invention will be described below with reference to the drawings.

FIG. 1 is a block diagram showing entire configurations of an electron beam drawing apparatus according to an embodiment of the present invention. The electron beam drawing apparatus in FIG. 1 includes a sample chamber 1, a conveying member 2 that controllably conveys samples (wafers or the like) into and out of the sample chamber 1, a sample chamber control device 3 that controls each section of the sample chamber 1, an electric lens system 4 provided above the sample chamber 1, a lens control device 5 that controls a lens in the electric lens system 4, a deflection control device 6 that controls various electrodes in the electric lens system 4, a drawing circuit 7, and a control computer 8 that controls the whole apparatus.

The sample chamber 1 has a stage 12 on which a sample 11 such as a semiconductor wafer is placed, a Z detector 13 that detects a height of a sample surface, and a vacuum device 14.

The sample chamber control device 3 has a signal processing section 21 that performs signal processing on reflected electrons, scattered electrons, or secondary electrons detected by an electron detector (not shown) placed above the stage 12, a Z detection control device 22 that controls the Z detector 13, which detects the height of the sample surface, a laser length measuring member 23 that detects the position of the stage 12, a position circuit 24 that controls the position of the stage 12, a motor driving circuit 25 that moves the stage 12, a stage control device 26 that controls movement of the stage 12, a temperature monitor section 27 that monitors the temperature of the sample chamber 1, a vacuum control device 28 that controls the degree of vacuum in the sample chamber 1, and a conveyer control device 29 that controls conveyance of the sample 11.

The electric lens system 4 has a blanking deflector 31 that controls a path of an electron beam so that the electron beam is not irradiated with the sample 11, a CP selective deflector 32 which has a plurality of electrode units to guide the electron beam to any pattern opening in an aperture mask substrate, a main deflector 33 that roughly adjusts a direction in which the electron beam is deflected, a sub-deflector 34 that finely adjusts the deflecting direction of the electron beam, a lens 35 that refracts the electron beam, a monitor section 36 that monitors the operation of each deflector, an aperture 40, and an electron detector (not shown) that detects reflected electrons, scattered electrons, or secondary electrons when the sample 11 is irradiated with the electron beam.

The lens control device 5 has a lens power source 37, an electron lens control system 38, and a monitor section 39.

The control computer 8 (EWS) operates in accordance with control software 41 and stores the results of calculations in a magnetic disk device. External drawing data is supplied to the control computer 8.

The electron beam drawing apparatus according to the embodiment adopts a character projection scheme. Drawing data to be drawn on the sample 11 is stored in a magnetic disk 42 connected to the control computer 8. In accordance with the software 41, the control computer 8 sends the drawing data read from the magnetic disk 42 to a drawing circuit 7. A pattern generator 43 in the drawing circuit 7 generates a drawing pattern corresponding to the drawing data. In accordance with the drawing pattern, a deflection control circuit 44 in the drawing circuit 7 controls voltages applied to the main deflector 33, the sub-deflector 34, the CP selective deflector 32 (character beam electrode), and the blanking deflector 31 (blanking electrode). The CP selective deflector 32 has a plurality of electrode units and voltages applied to the electrode units are individually controlled.

Although not shown in FIG. 1, the aperture mask substrate (referred to as a mask substrate below) is placed between the CP selective deflector 32 and the main deflector 33. Character openings of various shapes are formed in the mask substrate. The deflection control circuit 44 controls each deflector so that an electron beam passes through any of the character openings in the mask substrate.

FIG. 2 is a diagram showing an example of the locus of an electron beam. As shown in the figure, the CP selective deflector 32 has a plurality of electrode units 32a and 32b. An electron beam is deflected by the CP selective deflector 32 and then passes through any of the character openings 30a in the mask substrate 30 to produce image on the sample 11. To switch the character opening 30a through which the electron beam passes, the electron beam must be deflected out of the sample 11. Thus, as shown by a dotted line in FIG. 2, the blanking deflector 31 is used to significantly change the direction of the electron beam. In this manner, the blanking deflector 31 is utilized to switch the character opening 30a on the mask substrate 30.

FIG. 3 is a flowchart showing an example of a processing operation of the electron beam drawing apparatus according to the present embodiment. The flowchart is implemented by, for example, the deflection control device 6. First, a tolerance for a synchronization error in the CP selective deflector 32 is initialized (step S1). The synchronization error means differences of switching timings of voltages applied to a plurality of electrode units in the CP selective deflector 32.

Then, the CP selective deflector 32 is controlled to sequentially select at least two character openings 30a and 30b on the mask substrate 30. An electron beam is then guided to the selected character openings 30a and 30b (step S2).

Then, the deflection control device determines whether or not the synchronization error in the selective operation of step S2 is equal to or smaller than the tolerance (step S3). The amount of deflection is converted using deflection sensitivities of the plurality of electrode units in the CP selective deflector 32. The deflection control device then determines whether or not timing errors in accordance with the amount of deflection is equal to or smaller than the tolerance. If yes, the blanking deflector 31 is used to perform a beam blank operation of deflecting the electron beam in an outside direction of the sample 11 (step S4).

During the beam blank operation, as in the case of step S2, at least two character openings 30a and 30b on the mask substrate 30 are consecutively selected. An electron beam is then guided to the selected character openings 30a and 30b (step S5). Then, the deflection control device determines whether or not the electron beam has reached the sample 11 or the stage 12 (step S6). If the electron beam has not reached the sample 11, the deflection control device determines that the beam blank operation has been correctly performed, and the processing is finished. If the electron beam has reached the sample 11, the tolerance for the synchronization error is narrowed down (step S7).

If the value for the synchronization error is determined to be larger than the tolerance in step S3 or the processing in step S7 is finished, the apparatus shown in FIG. 1 is adjusted (step S8). The process subsequently returns to step S2. In the step S8, a circuit not shown for applying voltages to a plurality of electrode units in the CP selective deflector 32 is adjusted. More specifically, a timing adjustment for applying voltages to a plurality of electrode units and adjustment of voltage levels are conducted.

The processing in FIG. 3 may be conducted in a state of placing a dummy sample 11 or the like on the stage 12. In this case, the sample surface of the dummy sample 11 is coated with a resist that is sensitive to electron beams. Then, the processing in step S5 is conducted and then the dummy sample 11 is subjected to development processing. The sample surface is observed using an optical microscope, an electron microscope, or a position measuring apparatus to determine whether or not the sample surface has been irradiated with an electron beam.

Alternatively, a Faraday cup placed on the stage 12 may be used to detect a current to determine whether or not the electron beam has deflected out of the sample 11. Here, the Faraday cup is a cup-shaped detector that measures the current value corresponding to the electron beam.

Alternatively, an electron detector placed above the stage 12 may be used to detect reflected electrons, scattered electrons, or secondary electrons from the sample 11 to determine whether or not the electron beam has reached the sample 11.

By conducting the processing operations in FIG. 3, the electron beam drawing apparatus is adjusted so that the synchronous error of the deflected operation of the electron beam becomes equal to or less than the tolerance in the end. And then, fabrication of the semiconductor device is conducted by using the exposure apparatus. The processing operation in FIG. 3 is conducted regularly and irregularly.

Thus, in the present embodiment, during the beam blank period, the values for the synchronization errors of the plurality of electron sections in the CP selective deflector 32 are adjusted to be equal to or less than the tolerance. This enables the electron beam to be reliably deflected out of the sample surface during the beam blank period. As a result, defective patterning can be reliably prevented which results from beam leakage. This makes it possible to improve the yield of semiconductor devices produced using the electron beam drawing apparatus.

According to the present embodiment, if a large number of character openings 30a are formed in the mask substrate 30, drawing can be achieved using only the character openings 30a free from beam leakage. Further, by using the dummy sample 11 to adjust a synchronization error in the CP selective deflector 32, it is possible to set an appropriate reference for each device generation. Moreover, by using an electron detector to detect beam leakage, it is possible to adjust synchronization errors under the same conditions as those for the actual production of devices. Consequently, the adjustment can be accurately made. Further, by using a Faraday cup to detect beam leakage, it is possible to easily detect whether or not beam leakage occurs.

What is claimed is:

1. An electron beam control method, comprising:
   selecting one of a plurality of pattern openings by a character beam electrode having a plurality of electrode units to allow an electron beam to pass through any pattern opening on an aperture mask on which the plurality of pattern openings are formed;
   determining whether or not a synchronization error of deflected operation of the electron beam performed by the plurality of electrode units is equal to or less than a tolerance;
   determining whether or not the electron beam is irradiated with a sample by selecting the pattern openings in sequence by the character beam electrode in a state of controlling a path of the electron beam by a blanking electrode not to irradiate the sample with the electron beam, when determined that the synchronization error is equal to or less than the tolerance; and
   decreasing the tolerance when determined that the electron beam is irradiated with the sample.

2. An electron beam control method according to claim 1, wherein when determined that the synchronization error is larger than the tolerance, the character beam electrode is adjusted to set the synchronization error to be equal to or less than the tolerance.

3. An electron beam control method according to claim 1, wherein after decreasing the tolerance, it is determined whether or not the synchronization error is equal to or less than the tolerance.

4. An electron beam control method according to claim 1, wherein the synchronization error of the deflected operation of the electron beam is a timing error in accordance with the amount of deflection obtained by converting deflection sensitivities of the plurality of electrode units.

5. An electron beam control method according to claim 1, wherein the character beam electrode selects the plurality of pattern openings in sequence in a state of deflecting the electron beam out of a dummy sample on which a resist is applied;
   it is determined whether or not the electron beam is irradiated with the dummy sample; and
   the dummy sample is developed afterward to detect whether the electron beam is irradiated with the dummy sample.

6. An electron beam control method according to claim 1, wherein it is determined whether or not the electron beam is irradiated with the sample by detecting reflected electrons, scattered electrons, or secondary electrons of the electron beam irradiated with the sample or a stage putting the sample.

7. An electron beam control method according to claim 1, wherein it is determined whether or not the electron beam is irradiated with the sample, by detecting the electron beam by using a Faraday cup disposed on the stage.

8. An electron beam drawing apparatus, comprising:
   a blanking electrode which controls a path of an electron beam not to irradiate a sample with the electron beam;
   a character beam electrode having a plurality of electrode units, which selects one of a plurality of pattern openings formed on an aperture mask to allow the electron beam to pass through the selected pattern opening; and
   a deflected control unit which controls voltages or currents applied to the blanking electrode and the character beam electrode,
   wherein the deflected control unit includes:
   a synchronization error determination unit which determines whether or not a synchronization error of the deflected operation of the electron beam performed by the plurality of electrode units is equal to or less than a predetermined tolerance;
   a beam irradiation determination unit which selects in sequence the plurality of pattern openings by the character beam electrode in a state of driving the blanking electrode when determined that the synchronization error is equal to or less than the tolerance, to determine whether or not the electron beam is irradiated with the sample; and
   a tolerance control unit which decreases the tolerance when determined that the electron beam is irradiated with the sample by the beam irradiation determination unit.

9. An electron beam drawing apparatus according to claim 8, further comprising an adjustment unit which adjusts the character beam electrode to set the synchronization error to be equal to or less than the tolerance, when the synchronization error determination unit determines that the synchronization error is larger than the tolerance.

10. An electron beam drawing apparatus according to claim 8, wherein the synchronization error determination unit determines whether or not the synchronization error of the deflected operation of the electron beam performed by the plurality of electrode units is equal to or less than the tolerance, after the tolerance control unit decreases the tolerance.

11. An electron beam drawing apparatus according to claim 8, wherein the synchronization error of the deflected operation of the electron beam is a timing error in accordance with the amount of deflection obtained by converting deflection sensitivities of the plurality of electrode units.

12. An electron beam drawing apparatus according to claim 8, wherein the beam irradiation determination unit selects the plurality of pattern openings in sequence in a state of deflecting the electron beam out of a dummy sample on which a resist is applied;
  it is determined whether or not the electron beam is irradiated with the dummy sample; and
  the dummy sample is developed afterward to detect whether the electron beam is irradiated with the dummy sample.

13. An electron beam drawing apparatus according to claim 8, wherein the beam irradiation determination unit determines whether or not the electron beam is irradiated with the sample by detecting reflected electrons, scattered electrons, or secondary electrons of the electron beam irradiated with the sample or a stage putting the sample.

14. An electron beam drawing apparatus according to claim 8, wherein the beam irradiation determination unit determines whether or not the electron beam is irradiated with the sample, by detecting the electron beam by using a Faraday cup disposed on the stage.

15. A method of fabricating a semiconductor device, comprising:
  selecting one of a plurality of pattern openings by a character beam electrode having a plurality of electrode units to allow an electron beam to pass through any pattern opening on an aperture mask on which the plurality of pattern openings are formed;
  determining whether or not a synchronization error of deflected operation of the electron beam performed by the plurality of electrode units is equal to or less than a tolerance;
  determining whether or not the electron beam is irradiated with a sample by selecting the pattern openings in sequence by the character beam electrode in a state of controlling a path of the electron beam by a blanking electrode not to irradiate the sample with the electron beam, when determined that the synchronization error is equal to or less than the tolerance;
  decreasing the tolerance when determined that the electron beam is irradiated with the sample; and
  performing a fabrication of the semiconductor device after adjusting the synchronization error of the deflected operation of the electron beam to be equal to or less than the tolerance.

16. A method of fabricating a semiconductor device according to claim 15, wherein when determined that the synchronization error is larger than the tolerance, the character beam electrode is adjusted to set the synchronization error to be equal to or less than the tolerance.

17. A method of fabricating a semiconductor device according to claim 15, wherein after decreasing the tolerance, it is determined whether or not the synchronization error is equal to or less than the tolerance.

18. A method of fabricating a semiconductor device according to claim 15, wherein the synchronization error of the deflected operation of the electron beam is a timing error in accordance with the amount of deflection obtained by converting deflection sensitivities of the plurality of electrode units.

19. A method of fabricating a semiconductor device according to claim 15, wherein the character beam electrode selects the plurality of pattern openings in sequence in a state of deflecting the electron beam out of a dummy sample on which a resist is applied;
  it is determined whether or not the electron beam is irradiated with the dummy sample; and
  the dummy sample is developed afterward to detect whether the electron beam is irradiated with the dummy sample.

20. A method of fabricating a semiconductor device according to claim 15, wherein it is determined whether or not the electron beam is irradiated with the sample by detecting reflected electrons, scattered electrons, or secondary electrons of the electron beam irradiated with the sample or a stage putting the sample.

* * * * *